(12) United States Patent
Xu et al.

(10) Patent No.: US 10,146,362 B2
(45) Date of Patent: Dec. 4, 2018

(54) SHIFT REGISTER UNIT, A SHIFT REGISTER, A DRIVING METHOD, AND AN ARRAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Rui Xu, Beijing (CN); Xiaochuan Chen, Beijing (CN); Xi Chen, Beijing (CN); Lei Ma, Beijing (CN); Peizhi Cai, Beijing (CN); Xue Cao, Beijing (CN); Jinyu Li, Beijing (CN); Yanchen Li, Beijing (CN); Fengchun Pang, Beijing (CN); Xingyou Luo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 84 days.

(21) Appl. No.: 15/209,575

(22) Filed: Jul. 13, 2016

(65) Prior Publication Data
US 2017/0102814 A1 Apr. 13, 2017

(30) Foreign Application Priority Data
Oct. 10, 2015 (CN) .......................... 2015 1 0651164

(51) Int. Cl.
G06F 3/041 (2006.01)
G09G 3/36 (2006.01)
G06F 3/044 (2006.01)

(52) U.S. Cl.
CPC .......... *G06F 3/0416* (2013.01); *G06F 3/0412* (2013.01); *G09G 3/36* (2013.01);
(Continued)

(58) Field of Classification Search
None
See application file for complete search history.

(56) References Cited

U.S. PATENT DOCUMENTS

2014/0146026 A1 5/2014 Yu et al.

FOREIGN PATENT DOCUMENTS

CN 103943083 A 7/2014
CN 104217763 A 12/2014
(Continued)

OTHER PUBLICATIONS

First Chinese Office Action, for Chinese Patent Application No. 201510651164.5, dated Feb. 27, 2017, 13 pages.
(Continued)

*Primary Examiner* — Brian Butcher
(74) *Attorney, Agent, or Firm* — Kinney & Lange, P.A.

(57) ABSTRACT

The disclosure provides a shift register unit, a shift register, a driving method and an array substrate. The shift register unit may comprise a touch-controlled circuit comprising a touch-controlled turning-on module and a touch-controlled turning-off module, wherein a control of the touch-controlled turning-on module is connected to a touch-controlled turning-on signal, an input is connected to a negative power supply signal, and an output is connected to an output terminal, and the touch-controlled turning-on signal is a pulse signal at a start of a touch controlling period; and a control of the touch-controlled turning-off module is connected to a touch-controlled turning-off signal, an input of the touch-controlled turning-off module is connected to a positive power supply signal, and an output of the touch-
(Continued)

controlled turning-off module is connected to the output terminal, wherein the touch-controlled turning-off signal is a pulse signal at an end of the touch controlling period.

20 Claims, 5 Drawing Sheets

(52) U.S. Cl.
CPC ........... *G09G 3/3648* (2013.01); *G06F 3/044* (2013.01); *G09G 2310/0283* (2013.01); *G09G 2310/0286* (2013.01); *G09G 2310/061* (2013.01); *G09G 2310/08* (2013.01)

(56) References Cited

FOREIGN PATENT DOCUMENTS

| | | |
|---|---|---|
| CN | 104916251 A | 9/2015 |
| WO | 2013039685 A1 | 3/2013 |
| WO | 2015143813 | * 10/2015 |

OTHER PUBLICATIONS

Second Chinese Office Action, for Chinese Patent Application No. 201510651164.5, dated Jul. 17, 2017, 16 pages.

* cited by examiner

Fig. 5 providing, by a touch-controlled turning-on module, a negative power supply voltage VSS to an output terminal OUTPUT in response to receiving a touch-controlled turning-on signal VtH, at a start of a touch controlling period — S601 providing, by a touch-controlled turning-off module, a positive power supply voltage VDD to the output terminal OUTPUT in response to receiving a touch-controlled turning-off signal VtL, at an end of the touch controlling period — S602

SHIFT REGISTER UNIT, A SHIFT REGISTER, A DRIVING METHOD, AND AN ARRAY SUBSTRATE

TECHNICAL FIELD

The present application relates to a field of driving a displaying of liquid crystal, specifically, to a shift register unit, a shift register, a driving method and an array substrate.

BACKGROUND

The shift register is a circuit in which gate drivers for a LCD Panel are integrated on a glass substrate so as to drive a scanning of the LCD panel. A built-in touch screen may be grouped into a self-capacitance touch screen and a mutual-capacitance touch screen, which requires a time division driving of a touch-controlled driving electrode so as to implement a touch controlling function and a displaying function. Thus, in order to ensure an effect of touch controlling, a displaying period may be required to be reduced, which will lead to a degradation of a displaying effect. A traditional touch and display driver integrated (TDDI) built-in touch screen starts a touch controlling period after the displaying period ends, and continues the previous displaying period after the touch controlling period ends. Accordingly, the problem is in that traditional technologies reduce the displaying period and insert the touch controlling period into the displaying period, which will degrade the displaying effect significantly.

SUMMARY

According to an embodiment of the present disclosure, a shift register unit, a shift register, a driving method and an array substrate are provided.

According to one embodiment of the present disclosure, a shift register unit is provided, comprising: a gate line driving circuit configured to drive gate lines of a display panel to perform a progressive scanning and comprising an inputting module, a resetting module, a pulling up module, a pulling down module and an outputting module; and a touch-controlled circuit configured to determine whether the display panel is in a touch controlling stage or not and comprising a touch-controlled turning-on module and a touch-controlled turning-off module, wherein:

a control of the touch-controlled turning-on module is connected to a touch-controlled turning-on signal, an input of the touch-controlled turning-on module is connected to a negative power supply signal, and an output of the touch-controlled turning-on module is connected to an output terminal, and the touch-controlled turning-on signal is a pulse signal at a start of a touch controlling period; the touch-controlled turning-on module is configured to provide a negative voltage to the output terminal in response to receiving the touch-controlled turning-on signal, so as to cause the display panel in a touch controlling stage, wherein an output of the outputting module is used as the output terminal; and a control of the touch-controlled turning-off module is connected to a touch-controlled turning-off signal, an input of the touch-controlled turning-off module is connected to a positive power supply signal, and an output of the touch-controlled turning-off module is connected to the output terminal, wherein the touch-controlled turning-off signal is a pulse signal at an end of the touch controlling period; the touch-controlled turning-off module is configured to provide a positive voltage to the output terminal in response to receiving the touch-controlled turning-off signal, so as to cause the display panel in a displaying stage.

Preferably, the touch-controlled turning-on module may comprise:

a first thin-film transistor having a control being connected to the touch-controlled turning-on signal, an input being connected to the negative power supply signal, and an output being connected to the output terminal.

Preferably, the touch-controlled turning-off module may comprise:

a second thin-film transistor having a control being connected to the touch-controlled turning-off signal, an input being connected to the positive power supply signal, and an output being connected to the output terminal.

Preferably, the inputting module is configured to provide an input signal to a pulling up node when receiving the input signal or a second clock signal;

the outputting module is configured to provide a first clock signal to the output terminal when receiving a voltage signal at the pulling up node;

the resetting module is configured to provide the negative voltage to the pulling up node and the output terminal when receiving a resetting signal;

the pulling up module is configured to provide the second clock signal to a first pulling down node and a second pulling down node when receiving a high level of the second clock signal, and the pulling down module is configured to provide the negative voltage to the output terminal when receiving the high level of the second clock signal, to provide the negative voltage to the first pulling down node and the second pulling down node when receiving the voltage signal at the pulling up node, and to provide the negative voltage to the pulling up node and the output terminal when receiving a voltage signal at the second pulling down node.

According to another embodiment of the disclosure, a shift register comprising a plurality of cascaded shift register units is provided, wherein the shift register may comprise at least one shift register unit according to the present disclosure.

Each of the plurality of cascaded shift register units is the shift register unit according to the embodiment of the present disclosure.

According to still another embodiment of the disclosure, a gate driving apparatus on an array substrate comprising the shift register according to the embodiment of the present disclosure and a driving module is provided, wherein the driving module is configured to determine a touch controlling period according to a Blanking time of a clock signal, and transmit a touch-controlled turning-on signal to a touch-controlled turning-on module when the touch controlling period starts, and a touch-controlled turning-off signal to a touch-controlled turning-off module when the touch controlling period ends.

According to another embodiment of the disclosure, an array substrate comprising the gate driving apparatus on an array substrate according to the embodiment of the present disclosure is provided.

According to yet another embodiment of the disclosure, a display panel comprising the array substrate according to the embodiment of the present disclosure is provided.

According to another embodiment of the disclosure, a driving method for the shift register according to the embodiment of the present disclosure is provided, comprising:

providing, by a touch-controlled turning-on module, a negative power supply voltage to an output terminal in response to receiving a touch-controlled turning-on signal, at a start of a touch controlling period; and providing, by a touch-controlled turning-off module, a positive power supply voltage to the output terminal in response to receiving a touch-controlled turning-off signal, at an end of the touch controlling period.

Preferably, the driving method may further comprise:

providing, by an inputting module, an input signal to a pulling up node when receiving the input signal or a second clock signal, during a displaying period;

providing, by an outputting module, a first clock signal to the output terminal when receiving a voltage signal at the pulling up node;

providing, by a resetting module, the negative power supply voltage to the pulling up node and the output terminal when receiving a resetting signal;

providing, by a pulling up module, the second clock signal to a first pulling down node and a second pulling down node when receiving a high level of the second clock signal; and providing, by a pulling down module, the negative power supply voltage to the output terminal when receiving the high level of the second clock signal, the negative power supply voltage to the first pulling down node and the second pulling down node when receiving the voltage signal at the pulling up node, and the negative power supply voltage to the pulling up node and the output terminal when receiving a voltage signal at the second pulling down node.

DETAILED DESCRIPTION

The principles, detailed descriptions and advantageous effects of the embodiments of present disclosure will now be described with reference to the drawings in details. It is obvious that the illustrative embodiments described in the detailed description, drawings, and claims are only a part of the disclosure and not meant to be limiting. In view of the disclosed embodiments, other embodiments and other changes may be made without departing from the spirit or scope of the subject matter presented herein.

The present disclosure provides a shift register unit, a shift register, a driving method and an array substrate, which may implement a touch controlling of a display panel without affecting a normal displaying of the display panel, so as to improve a displaying effect of the display panel.

It should be noted that a clock signal herein may include a conventional clock signal CLK and a conventional clock signal CLKB. Generally, the shift register may be composed of a plurality of cascaded shift register units, wherein each shift register may comprise several rows, and each row may comprise a shift register unit. Clock signals inputted into the shift register units corresponding to odd rows are clock signals CLK, and clock signals inputted into the shift register units corresponding to even rows are clock signals CLKB. In the disclosure, a first clock signal CLK1 is the clock signal CLK, and a second clock signal CLK2 is the clock signal CLKB. In addition, a voltage at a negative pole of a power supply VSS is at a low level. In the disclosure, thin film transistors (TFTs) used herein may be N-type TFTs and/or P-type TFTs. As an example, all of the thin film transistors (TFTs) discussed herein are N-type TFTs, wherein each of the TFTs is turned on when its gate voltage is at a high level and turned off when the gate voltage is at a low level.

Furthermore, a touch controlling period discussed herein may refer to a Blanking period of a clock signal, which does not occupy any part of a displaying period. Thus, the displaying period will not be reduced.

The shift register unit according to the embodiment of the present disclosure is an improvement in a shift register manufactured by a traditional amorphous silicon process. In the present disclosure, two types of signals are provided, one is a touch-controlled turning-on signal, and the other is a touch-controlled turning-off signal. The touch-controlled turning-on signal is a single pulse signal at a start of a touch controlling period, and configured to provide a low level to an output terminal, so as to cause being in a touch controlling stage. The touch-controlled turning-off signal is a single pulse signal at an end of the touch controlling period, and configured to provide a high level to the output terminal, so as to cause the display panel terminate the touch controlling stage and be in a displaying stage again. When being in the displaying stage again, a scanning direction on the gate lines in the present displaying period is opposite to the scanning direction in the last displaying period, so as to implement a bidirectional scanning on the gate lines.

First Embodiment

Figure 1:
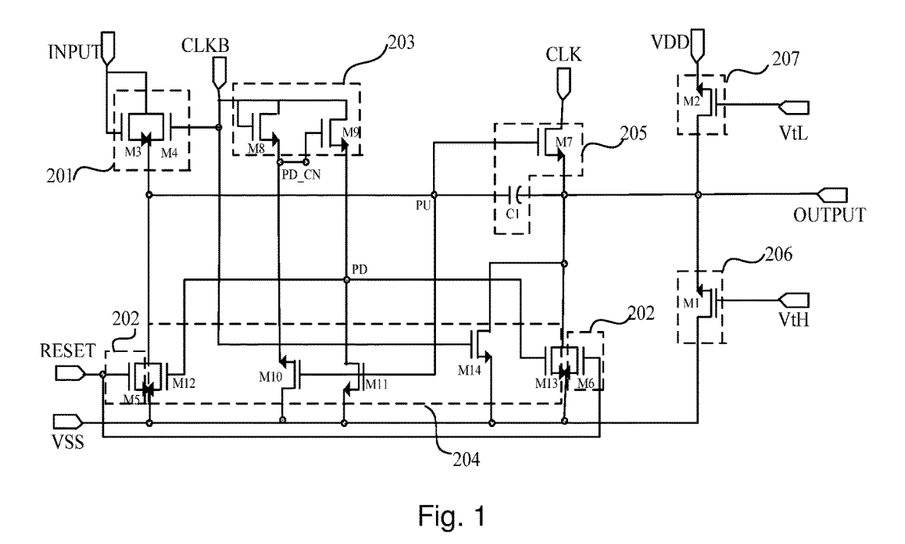
FIG. 1 is a schematic diagram illustrating the shift register unit according to an embodiment of the disclosure.

As shown in FIG. 1, a shift register unit is provided, which may comprise: a gate line driving circuit configured to drive a gate line of a display panel to perform a progressive scanning and comprising an inputting module 201, a resetting module 202, a pulling up module 203, a pulling down module 204 and an outputting module 205; and a touch-controlled circuit configured to determine whether the display panel is in a touch controlling stage or not and comprising a touch-controlled turning-on module 206 and a touch-controlled turning-off module 207, wherein:

a control of the touch-controlled turning-on module 206 is connected to a touch-controlled turning-on signal VtH, an input of the touch-controlled turning-on module 206 is connected to a negative power supply signal VSS, and an output of the touch-controlled turning-on module 206 is connected to an output terminal OUTPUT, and the touch-controlled turning-on signal VtH is a pulse signal at a start of a touch controlling period; the touch-controlled turning-on module 206 is configured to provide the negative power supply signal VSS to the output terminal OUTPUT in response to receiving the touch-controlled turning-on signal VtH, so as to cause the display panel in a touch controlling stage, wherein an output of the outputting module 205 is used as the output terminal OUTPUT; and a control of the touch-controlled turning-off module 207 is connected to a touch-controlled turning-off signal VtL, an input of the touch-controlled turning-off module 207 is connected to a positive power supply signal VDD, and an output of the touch-controlled turning-off module 207 is connected to the output terminal OUTPUT, wherein the touch-controlled turning-off signal VtL is a pulse signal at an end of the touch controlling period; the touch-controlled turning-off module 207 is configured to provide the positive power supply signal VDD to the output terminal OUTPUT in response to receiving the touch-controlled turning-off signal VtL, so as to cause the display panel in a displaying stage.

Each of the above modules has a control being connected to a gate of a thin film transistor (TFT), an input being connected to a source of the TFT, and an output being connected to a drain of the TFT. In an alternative embodiment, each of the above modules may also have a control being connected to a gate of a thin film transistor (TFT), an input being connected to a drain of the TFT, and an output being connected to a source of the TFT.

In addition, the touch-controlled turning-on module 206 may comprise:

a first thin-film transistor M1 having a gate being connected to the touch-controlled turning-on signal VtH, a source being connected to the negative power supply signal VSS, and a drain being connected to the output terminal OUTPUT.

In addition, the touch-controlled turning-off module 207 may comprise:

a second thin-film transistor M2 having a gate being connected to the touch-controlled turning-off signal VtL, a source being connected to the positive power supply signal VDD, and a drain being connected to the output terminal OUTPUT.

In addition, the inputting module 201 is configured to provide an input signal INPUT to a pulling up node PU when receiving the input signal INPUT or a second clock signal CLKB.

The input module 201 may comprise:

a third thin-film transistor M3 having a gate and a source being connected to the input signal INPUT, and a drain being connected to the pulling up node PU; and a fourth thin-film transistor M4 having a gate being connected to a second clock signal CLKB, a source being connected to the input signal INPUT, and a drain being connected to the pulling up node PU.

In addition, the resetting module 202 may be configured to provide the negative voltage VSS to the pulling up node PU and the output terminal OUTPUT when receiving a resetting signal RESET.

The resetting module 202 may comprise:

a fifth thin-film transistor M5 having a gate being connected to the resetting signal RESET, a source being connected to the negative voltage VSS, and a drain being connected to the pulling up node PU; and a sixth thin-film transistor M6 having a gate being connected to the resetting signal RESET, a source being connected to the negative voltage VSS, and a drain being connected to the output terminal OUTPUT.

In addition, the outputting module 205 may be configured to provide a first clock signal CLK to the output terminal OUTPUT when receiving a voltage signal at the pulling up node PU.

The outputting module 205 may comprise:

a seventh thin-film transistor M7 having a gate being connected to the pulling up node PU, a source being connected to the first clock signal CLK, and a drain being connected to the output terminal OUTPUT; and a first capacitor C1, which is connected between the pulling up node PU and the output terminal OUTPUT.

In addition, the pulling up module 203 is configured to provide the second clock signal CLKB to a first pulling down node PD_CN and a second pulling down node PD when receiving a high level of the second clock signal CLKB.

The pulling up module 203 may comprise:

an eighth thin-film transistor M8 having a gate and a source being connected to the second clock signal CLKB, and a drain being connected to the first pulling down node PD_CN; and a ninth thin-film transistor M9 having a gate being connected to the first pulling down node PD_CN, a source being connected to the second clock signal CLKB, and a drain being connected to the second pulling down node PD.

In addition, the pulling down module 204 may be configured to provide the negative voltage VSS to the output terminal OUTPUT when receiving the high level of the second clock signal CLKB, to provide the negative voltage VSS to the first pulling down node PD_CN and the second pulling down node PD when receiving the voltage signal at the pulling up node PU, and to provide the negative voltage VSS to the pulling up node PU and the output terminal OUTPUT when receiving a voltage signal at the second pulling down node PD.

The pulling down module 204 may comprise:

a tenth thin-film transistor M10 having a gate being connected to the pulling up node PU, a source being connected to the negative voltage VSS, and a drain being connected to the first pulling down node PD_CN;

an eleventh thin-film transistor M11 having a gate being connected to the pulling up node PU, a source being connected to the negative voltage VSS, and a drain being connected to the second pulling down node PD;

a twelfth thin-film transistor M12 having a gate being connected to the second pulling down node PD, a source being connected to the negative voltage VSS, and a drain being connected to the pulling up node PU;

a thirteenth thin-film transistor M13 having a gate being connected to the second pulling down node PD, a source being connected to the negative voltage VSS, and a drain being connected to the output terminal OUTPUT; and a fourteenth transistor M14 having a gate being connected to the second clock signal CLKB, a source being connected to the negative voltage VSS, and a drain being connected to the output terminal OUTPUT.

Figure 2:
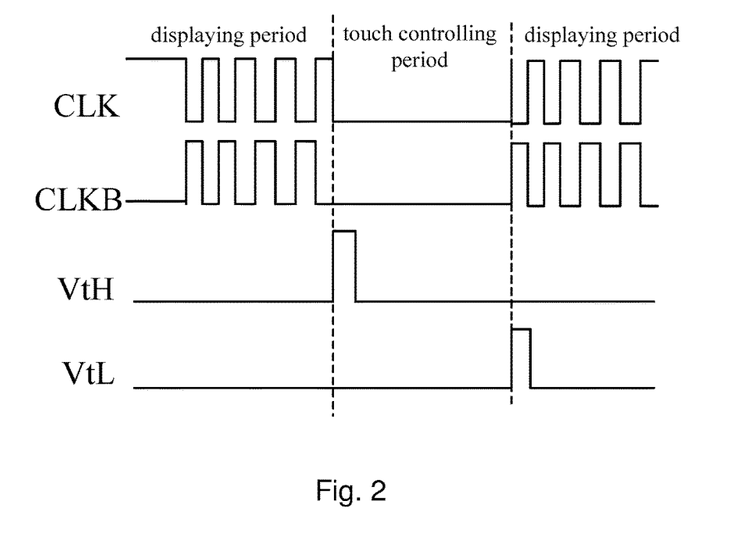
FIG. 2 shows waveform diagrams of the touch-controlled turning-on signal and the touch-controlled turning-off signal according to the embodiment of the disclosure.

As shown in FIG. 2, waveforms of a first clock signal CLK, a second clock signal CLKB, a touch-controlled turning-on signal VtH and a touch-controlled turning-off signal VtL are illustrated. Touch controlling periods are Blanking periods of the first clock signal CLK and the second clock signal CLKB. There is a Blanking period after the clock signal scans n rows of gate lines. At a start of the Blanking period, the touch-controlled turning-on signal VtH is at a high level, and thus the first TFT M1 is turned on so as to provide the negative voltage to the output terminal. That is, at the start of this period, the output terminal is at a low level, which stops scanning on the gate lines and terminates a displaying period. At an end of the Blanking period, the touch-controlled turning-off signal VtL is at a high level, and thus the second TFT M2 is turned on so as to provide the positive voltage to the output terminal. That is, at the end of this period, the output terminal is at a high level, which begins scanning on the gate lines in an opposite direction and terminates a touch controlling period.

It should be noted that although the touch-controlled turning-on signal changes from a high level to a low level, the output terminal will keep being at a low level until the high level of the touch-controlled turning-off signal pulls the output terminal up to a high level. Herein, the touch controlling period may refer to a period in which the output terminal is at a low level.

In the disclosure, a shift register comprising a plurality of cascaded shift register units is provided, wherein the shift register may comprise at least one shift register unit according to the embodiment of the present disclosure.

Preferably, each of the plurality of cascaded shift register units is the shift register unit according to the embodiment of the present disclosure.

It should be noted that generally each shift register may comprise a plurality of cascaded shift register units having a same structure, however the shift register according to the embodiment of the disclosure may also comprise the shift register unit according to the embodiment of the present disclosure as well as a traditional shift register unit which does not include the touch-controlled turning-on module and the touch-controlled turning-off module.

Figure 3:
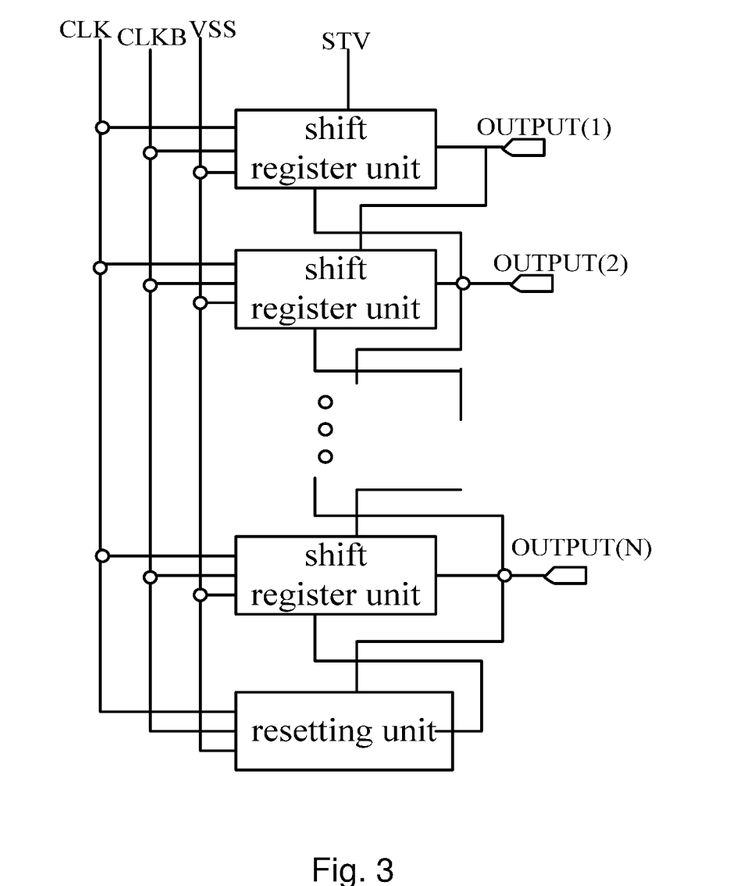
FIG. 3 is a schematic diagram illustrating a shift register according to one embodiment of the disclosure.

As an example, the shift register in FIG. 3 has a plurality of cascaded shift register units. Provided that a whole gate driving circuit according to this embodiment of the disclosure has N stages of shift register units, and N is the number of the gate lines. In this case, an input signal for the shift register unit in a first stage is a Start Vertical (STV) signal, while a resetting signal for the shift register unit in a first stage is provided by an OUTPUT of the shift register unit in a second stage, and an input signal for the shift register unit in a $n^{th}$ stage is provided by an output of the shift register unit in a $(n-1)^{th}$ stage, while a resetting signal for the shift register unit in a $n^{th}$ stage is provided by a resetting unit.

Figure 4:
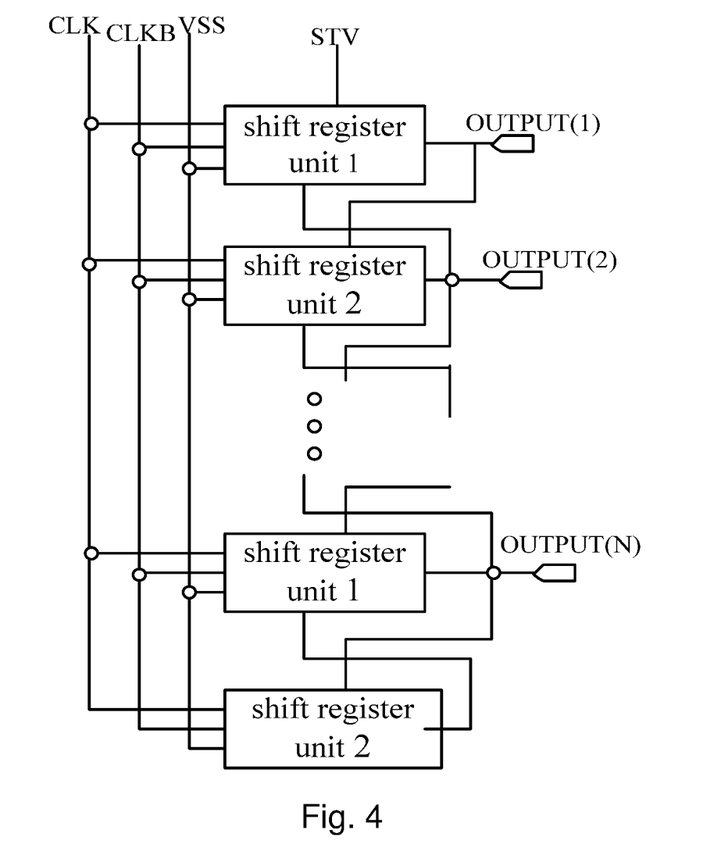
FIG. 4 is a schematic diagram illustrating a shift register according to another embodiment of the disclosure.
Figure 5:
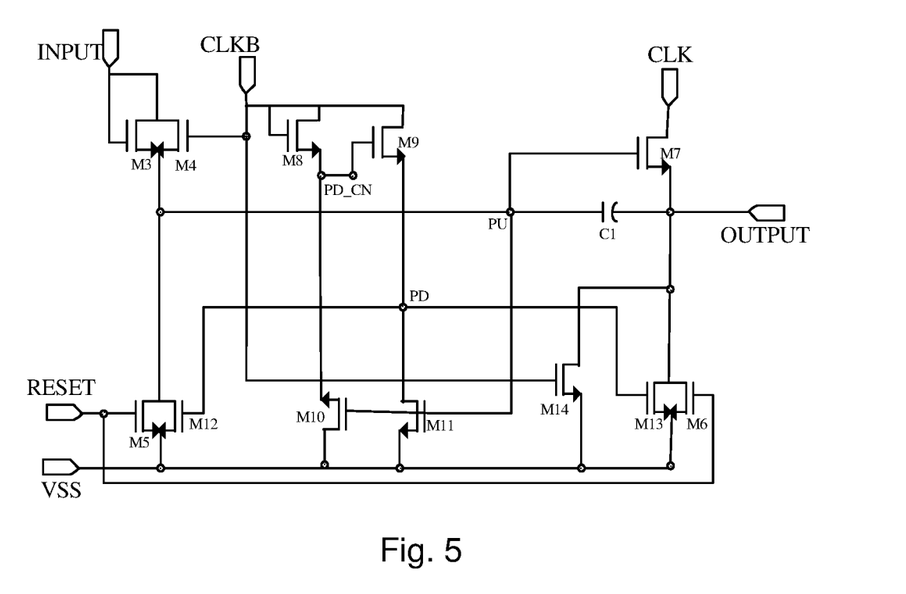
FIG. 5 is a schematic diagram illustrating a shift register unit according to another embodiment of the disclosure.

As shown in FIG. 4, the shift register according to the embodiment of the disclosure may comprise two types of shift register units, wherein a first type of the shift register unit has a structure shown in FIG. 1, and a second type of the shift register unit has a structure shown in FIG. 5. It is seen from FIG. 4 that the number of the first type of the shift register units is same with the number of the second type of the shift register units.

It should be also noted that when the shift register comprises two types of shift register units, the positions and numbers of these two types of shift register units may be appropriately configured according to an area for implementing the touch controlling in the display panel, in addition to configuring these two types of shift register units to have the same number. For example, all or a part of the shift register units in the display panel may be configured as the first type of shift register unit, which is not limited in the disclosure. It is obvious that the specific configuration may also depend on a resolution of the display panel and a requirement on the touch controlling.

The shift register according to this embodiment can perform a displaying function and a touch controlling function. The touch controlling periods are Blanking periods of the clock signal. In other words, at an end of a displaying period, the output terminal is pulled down to a low level by the touch-controlled turning-on signal, so as to stop the shift register scanning any gate line and implement the touch controlling function; and then the output terminal is pulled up to a high level by the touch-controlled turning-off signal, so as to enable the shift register to scan a gate line, which will cause terminating the touch controlling stage and being in a displaying stage again. When being in the displaying stage again, a scanning direction on gate lines in the present displaying period is opposite to the scanning direction in the last displaying period, so as to implement a bidirectional scanning on gate lines. In summary, the shift register according to the disclosure will change into the touch controlling stage in response to receiving the touch-controlled turning-on signal, such that the shift register according to the disclosure may implement the touch controlling of the display panel without affecting a normal displaying of the shift register, which will improve a displaying effect of the display panel.

Second Embodiment

Figure 6:
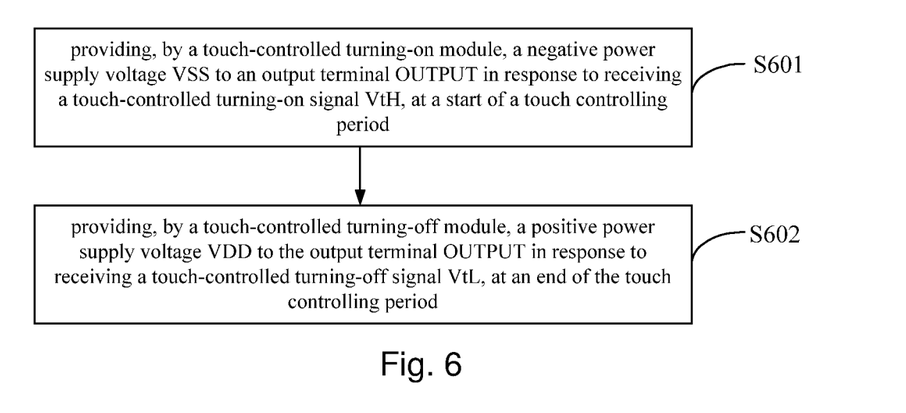
FIG. 6 is a flow char illustrating the driving method for the shift register according to the embodiment of the disclosure.

As shown in FIG. 6, a driving method for a shift register is provided, comprising:

in S601, providing, by a touch-controlled turning-on module, a negative power supply voltage VSS to an output terminal OUTPUT in response to receiving a touch-controlled turning-on signal VtH, at a start of a touch controlling period; and in S602, providing, by a touch-controlled turning-off module, a positive power supply voltage VDD to the output terminal OUTPUT in response to receiving a touch-controlled turning-off signal VtL, at an end of the touch controlling period.

In addition, the driving method may further comprise:

providing, by an inputting module, an input signal INPUT to a pulling up node PU when receiving the input signal INPUT or a second clock signal CLKB, during a displaying period;

providing, by an outputting module, a first clock signal CLK to the output terminal OUTPUT when receiving a voltage signal at the pulling up node PU;

providing, by a resetting module, the negative power supply voltage VSS to the pulling up node PU and the output terminal OUTPUT when receiving a resetting signal RESET;

providing, by a pulling up module, the second clock signal CLKB to a first pulling down node PD_CN and a second pulling down node PD when receiving a high level of the second clock signal CLKB; and providing, by a pulling down module, the negative power supply voltage VSS to the output terminal OUTPUT when receiving the high level of the second clock signal CLKB, the negative power supply voltage VSS to the first pulling down node PD_CN and the second pulling down node PD when receiving the voltage signal at the pulling up node PU, and the negative power supply voltage VSS to the pulling up node PU and the output terminal OUTPUT when receiving a voltage signal at the second pulling down node PD.

Hereinafter, the driving method for the shift register according to the embodiment of the disclosure is discussed with reference to a specific timing diagram.

Figure 7:
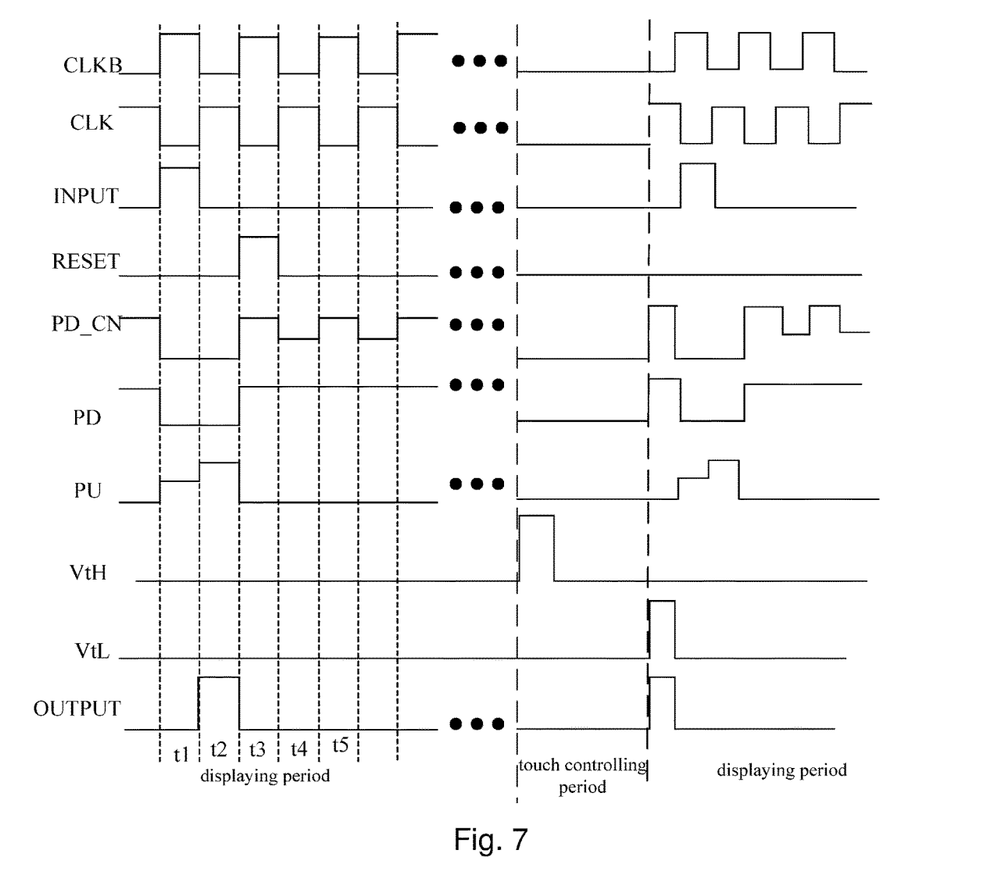
FIG. 7 is a timing diagram for the driving method according to the embodiment of the disclosure.

Specifically, the driving method for the shift register according to the embodiment of the disclosure is discussed with reference to the timing diagram shown in FIG. 7, which may comprise:

At a first phase t1 of the display period, when the input signal INPUT and the second clock signal CLKB are both at a high level, and the first clock signal CLK and the resetting signal RESET are both at a low level, the third TFT M3 and the fourth TFT M4 will be turned on, the pulling up node PU will be at a high level, and meanwhile the first capacitor C1 will be charged; the tenth TFT M10 will be turned on due to the high level at the pulling up node PU, which leads to providing the negative power supply voltage VSS to the first pulling down node PD_CN; the eleventh TFT M11 will be also turned on due to the high level at the pulling up node PU, which leads to providing the negative power supply voltage VSS to the second pulling down node PD; the fourteenth TFT M14 will be turned on due to the high level of the second clock signal CLKB, which leads to providing the negative power supply voltage VSS to the output terminal OUTPUT; meanwhile the seventh TFT M7 will be also turned on due to the high level at the pulling up node PU, which leads to providing a low level of the clock signal CLK to the output terminal OUTPUT. Thus, the output terminal OUTPUT is at a low level.

At a second phase t2 of the display period, when the input signal INPUT, the second clock signal CLKB and the resetting signal RESET are all at a low level, and the first clock signal CLK is at a high level, the third TFT M3 and the fourth TFT M4 will be turned off, and the pulling up node PU will be kept at a high level due to a discharging of the first capacitor C1; the seventh TFT M7 will be still turned on due to the high level at the pulling up node PU, which leads to providing the high level of the first clock signal CLK to the output terminal OUTPUT, meanwhile the thirteenth TFT M13 will be turned off due to the low level of the second clock signal CLKB. Thus, the output terminal OUTPUT is at a high level.

At a third phase t3 of the display period, when the input signal INPUT and the first clock signal CLK are both at a low level, and the second clock signal CLKB and the resetting signal RESET are both at a high level, the fifth TFT M5 will be turned on, which leads to providing the negative voltage VSS to the pulling up node PU, so as to pull the pulling up node PU down to a low level; the sixth TFT M6 will be turned on, which leads to providing the negative voltage VSS to the output terminal OUTPUT, so as to pull the output terminal OUTPUT down to a low level; the eighth TFT M8 will be turned on is turned on, which leads to providing the high level to the first pulling down node PD_CN; the ninth TFT M9 will be turned on due to the high level at the first pulling down node PD_CN, which leads to pulling the second pulling down PD up to the high level; the twelfth TFT M12 will be turned on due to the high level at the second pulling down node PD, which leads to providing the negative power supply voltage VSS to the pulling up node PU; meanwhile, the thirteenth TFT M13 will be also turned on due to the high level at the second pulling down node PD, which leads to providing the negative power supply voltage VSS to the output terminal OUTPUT. Thus, the output terminal OUTPUT is at a low level.

At a fourth phase t4 of the display period, when the input signal INPUT, the second clock signal CLKB and the resetting signal RESET are all at a low level, and the first clock signal CLK is at a high level, the second pulling down not PD will be at a high level, which leads to turning on the twelfth TFT M12 and then providing the negative voltage VSS to the pulling up node PU; the thirteenth TFT M13 will be turned on due to the high level at the pulling up node PU, which leads to providing the negative voltage VSS to the output terminal OUTPUT. Thus, the output terminal OUTPUT is at a low level.

At a fifth phase t5 of the display period, when the input signal INPUT, the first clock signal CLK and the resetting signal RESET are all at a low level, and the second clock signal CLKB is at a high level, the fourth TFT M4 will be turned on, which leads to providing the low level of the input signal INPUT to the pulling up node PU; the fourteenth TFT M14 will be also turned on, which leads to providing the negative voltage VSS to the output terminal OUTPUT; the eighth TFT M8 will be also turned on, which leads to providing the high level to the first pulling down node PD_CN; the ninth TFT M9 will be turned on due to the high level at the first pulling down node PD_CN, which leads to providing the high level to the second pulling down node PD; the twelfth TFT M12 will be turned on due to the high level at the second pulling down node PD, which leads to providing the negative voltage VSS to the pulling up node PU; meanwhile the thirteenth TFT M13 will be also turned on due to the high level at the second pulling down node PD, which leads to providing the negative voltage VSS to the output terminal OUTPUT. Thus, the output terminal OUTPUT is at a low level.

During a displaying stage, operations in the fourth phase t4 and the fifth phase t5 are repeated in turn, until timings in the first phase t1, the second phase t2 and the third phase t3 appear again. Then, operations in the first phase t1, the second phase t2 and the third phase t3 are performed again. This process will be performed until n rows of gate lines are all scanned.

At an end of the displaying stage, i.e. when the n rows of gate lines have been scanned, the clock signal may have a Blanking period. In the present disclosure, the Blanking period is used as a touch controlling period.

At a start of the touch controlling period, the touch-controlled turning-on signal VtH is at a high level and the touch-controlled turning-off signal VtL is at a low level. At this time, the first TFT M1 will be turned on, which leads to providing the negative voltage VSS to the output terminal OUTPUT. Thus, the output terminal OUTPUT is at a low level, so as to stop the shift register scanning on the gate lines, i.e. implementing a touch controlling function.

At an end of the touch controlling period, the touch-controlled turning-off signal VtL is at a high level and the touch-controlled turning-on signal VtH is at a low level. At this time, the second TFT M2 will be turned on, which leads to providing the positive voltage VDD to the output terminal OUTPUT. Thus, the output terminal OUTPUT is at a high level, so as to enable the shift register scanning on the gate lines again, and therefore terminating the touch controlling function and enabling a gate line scanning function.

When being in the displaying stage again, the output terminal OUTPUT is at a high level, i.e. the output terminal has been charged. Thus, each gate line will be scanned in reverse.

Scanning in reverse discussed herein means that if the gate lines are scanned from a first gate line to a $N^{th}$ gate line before implementing the touch controlling function, the gate lines may be scanned from a $N^{th}$ gate line to a first gate line after implementing the touch controlling function, so as to implement a bidirectional scanning.

It should be noted that the touch controlling period can be set according to a driving IC. For example, a Blanking period can be present after scanning all rows of the gate lines, or after scanning the gate lines bi-directionally. Furthermore, the duration of the Blanking period can be adjusted according to a resolution of the display panel and an area for implementing the touch controlling function. In particular, when to set the Blanking period and how long the Blanking period lasts are both not restricted in the disclosure.

In the driving method for a shift register according to the embodiment of the disclosure, during a displaying period, the output terminal OUTPUT and the pulling up node PU are pulled to a low level by the resetting module and the pulling down module in turn, so as to ensure the output terminal OUTPUT and the pulling up node PU being at a low level in periods other than a period in which the shift register outputs a high level; once receiving a high level of the touch-controlled turning-on signal, a touch controlling period starts. At this time, the negative voltage is provided to the output terminal OUTPUT under the high level of touch-controlled turning-on signal, so as to implement a touch controlling function; once receiving a high level of the touch-controlled turning-off signal, a touch controlling period ends. At this time, the positive voltage is provided to the output terminal OUTPUT under the high level of touch-controlled turning-off signal, so as to continue scanning the gate lines. At this moment, the gate lines will be scanned in a direction which is opposite to a scanning direction before implementing the touch controlling function. Thus, a bi-directional scanning can be performed, and a touch controlling of the display panel can be implemented without affecting a normal displaying of the display panel, so as to improve a displaying effect of the display panel.

In the disclosure, a gate driving apparatus on an array substrate is provided, comprising the shift register according to the embodiments of the disclosure and a driving module, wherein the driving module is configured to determine a touch controlling period according to a Blanking period of a clock signal, and transmit a touch-controlled turning-on signal to a touch-controlled turning-on module when the touch controlling period starts, and a touch-controlled turning-off signal to a touch-controlled turning-off module when the touch controlling period ends.

In the disclosure, the driving module is implemented as a driving integrated circuit, which can determine the touch controlling period according to the Blanking period of the clock signal for the display panel, or according to a resolution and a touch controlling performance of the display panel. In particular, a Blanking period can be present after scanning all rows of the gate lines, or after scanning the gate lines bi-directionally. In addition, the duration of the Blanking period can be adjusted according to a resolution of the display panel and an area for implementing the touch controlling function. In particular, when to set the Blanking period and how long the Blanking period lasts are both not restricted in the disclosure.

In the disclosure, an array substrate comprising the gate driving apparatus on an array substrate according to the embodiment of the disclosure is provided.

In the disclosure, a display panel comprising the array substrate according to the embodiment of the disclosure is provided.

According to the shift register unit discussed in the embodiment of the disclosure, the touch-controlled turning-on module may provide a negative power supply voltage to an output terminal in response to receiving a touch-controlled turning-on signal, so as to provide a low level to the output terminal OUTPUT. Then the scanning of the gate lines corresponding to the shift register unit will be stopped, which leads to terminating the displaying stage and being in a touch controlling stage. After being in the touch controlling stage again, a scanning direction on the gate lines in the present displaying period is opposite to the scanning direction in the last displaying period, so as to implement a bidirectional scanning on the gate lines.

Obviously, it will be understood by those skilled in the art that various changes in form and details may be made therein without departing from the spirit and scope of the present disclosure as restricted by the appended claims and their equivalents.

We claim:
1. A shift register unit, comprising:
a gate line driving circuit configured to drive gate lines of a display panel to perform a progressive scanning, the gate line driving circuit comprises an inputting module, a resetting module, a pulling up module, a pulling down module and an outputting module; and
a touch-controlled circuit comprising a touch-controlled turning-on module and a touch-controlled turning-off module,
wherein a control of the touch-controlled turning-on module is connected to receive a touch-controlled turning-on signal, an input of the touch-controlled turning-on module is connected to receive a negative power supply signal, and an output of the touch-controlled turning-on module is connected to an output terminal of the shift register unit, and the touch-controlled turning-on signal is a pulse signal at a start of a touch controlling period;
wherein the touch-controlled turning-on module is configured to provide a negative voltage to the output terminal in response to receiving the touch-controlled turning-on signal, so as to cause the display panel to execute an operation of touch controlling, wherein an output of the outputting module is used as the output terminal,
wherein a control of the touch-controlled turning-off module is connected to receive a touch-controlled turning-off signal, an input of the touch-controlled turning-off module is connected to receive a positive power supply signal, and an output of the touch-controlled turning-off module is connected to the output terminal, wherein the touch-controlled turning-off signal is a pulse signal at an end of the touch controlling period; the touch-controlled turning-off module is configured to provide a positive voltage to the output terminal in response to receiving the touch-controlled turning-off signal, so as to cause the display panel to execute an operation of displaying.

2. The shift register unit of claim 1, wherein the touch-controlled turning-on module comprises:
a first thin-film transistor, having a control being connected to receive the touch-controlled turning-on signal, an input being connected to receive the negative power supply signal, and an output being connected to the output terminal.

3. The shift register unit of claim 1, wherein the touch-controlled turning-off module comprises:
a second thin-film transistor, having a control being connected to receive the touch-controlled turning-off signal, an input being connected to receive the positive power supply signal, and an output being connected to the output terminal.

4. The shift register unit of claim 1, wherein the inputting module is configured to provide an input signal to a pulling up node when receiving the input signal or a second clock signal;
the outputting module is configured to provide a first clock signal to the output terminal when receiving a voltage signal at the pulling up node;
the resetting module is configured to provide the negative voltage to the pulling up node and the output terminal when receiving a resetting signal;

the pulling up module is configured to provide the second clock signal to a first pulling down node and a second pulling down node when receiving a high level of the second clock signal, and the pulling down module is configured to provide the negative voltage to the output terminal when receiving the high level of the second clock signal, to provide the negative voltage to the first pulling down node and the second pulling down node when receiving the voltage signal at the pulling up node, and to provide the negative voltage to the pulling up node and the output terminal when receiving a voltage signal at the second pulling down node.

5. A shift register comprising a plurality of cascaded shift register units, wherein the shift register comprises at least one shift register unit of claim 1.

6. A shift register comprising a plurality of cascaded shift register units, wherein the shift register comprises at least one shift register unit of claim 2.

7. A shift register comprising a plurality of cascaded shift register units, wherein the shift register comprises at least one shift register unit of claim 3.

8. A shift register comprising a plurality of cascaded shift register units, wherein the shift register comprises at least one shift register unit of claim 4.

9. A shift register comprising a plurality of cascaded shift register units, wherein each of the plurality of cascaded shift register units is the shift register unit of claim 1.

10. A shift register comprising a plurality of cascaded shift register units, wherein each of the plurality of cascaded shift register units is the shift register unit of claim 2.

11. A shift register comprising a plurality of cascaded shift register units, wherein each of the plurality of cascaded shift register units is the shift register unit of claim 3.

12. A shift register comprising a plurality of cascaded shift register units, wherein each of the plurality of cascaded shift register units is the shift register unit of claim 4.

13. A gate driving apparatus on an array substrate, comprising the shift register of claim 5 and a driving module, wherein the driving module is configured to determine a touch controlling period according to a blanking period of a clock signal, transmit a touch-controlled turning-on signal to a touch-controlled turning-on module when the touch controlling period starts, and transmit a touch-controlled turning-off signal to a touch-controlled turning-off module when the touch controlling period ends.

14. A gate driving apparatus on an array substrate, comprising the shift register of claim 9 and a driving module, wherein the driving module is configured to determine a touch controlling period according to a blanking period of a clock signal, transmit a touch-controlled turning-on signal to a touch-controlled turning-on module when the touch controlling period starts, and transmit a touch-controlled turning-off signal to a touch-controlled turning-off module when the touch controlling period ends.

15. An array substrate comprising the gate driving apparatus on an array substrate of claim 13.

16. A display panel comprising the array substrate of claim 15.

17. A driving method for the shift register of claim 5, comprising:
providing, by a touch-controlled turning-on module, a negative power supply voltage to an output terminal in response to receiving a touch-controlled turning-on signal, at a start of a touch controlling period; and
providing, by a touch-controlled turning-off module, a positive power supply voltage to the output terminal in response to receiving a touch-controlled turning-off signal, at an end of the touch controlling period.

18. A driving method for the shift register of claim 9, comprising:
providing, by a touch-controlled turning-on module, a negative power supply voltage to an output terminal in response to receiving a touch-controlled turning-on signal, at a start of a touch controlling period; and
providing, by a touch-controlled turning-off module, a positive power supply voltage to the output terminal in response to receiving a touch-controlled turning-off signal, at an end of the touch controlling period.

19. The driving method of claim 17, comprising:
providing, by an inputting module, an input signal to a pulling up node when receiving the input signal or a second clock signal, during a displaying period;
providing, by an outputting module, a first clock signal to the output terminal when receiving a voltage signal at the pulling up node;
providing, by a resetting module, the negative power supply voltage to the pulling up node and the output terminal when receiving a resetting signal;
providing, by a pulling up module, the second clock signal to a first pulling down node and a second pulling down node when receiving a high level of the second clock signal; and
providing, by a pulling down module, the negative power supply voltage to the output terminal when receiving the high level of the second clock signal, the negative power supply voltage to the first pulling down node and the second pulling down node when receiving the voltage signal at the pulling up node, and the negative power supply voltage to the pulling up node and the output terminal when receiving a voltage signal at the second pulling down node.

20. The driving method of claim 18, comprising:
providing, by an inputting module, an input signal to a pulling up node when receiving the input signal or a second clock signal, during a displaying period;
providing, by an outputting module, a first clock signal to the output terminal when receiving a voltage signal at the pulling up node;
providing, by a resetting module, the negative power supply voltage to the pulling up node and the output terminal when receiving a resetting signal;
providing, by a pulling up module, the second clock signal to a first pulling down node and a second pulling down node when receiving a high level of the second clock signal; and
providing, by a pulling down module, the negative power supply voltage to the output terminal when receiving the high level of the second clock signal, the negative power supply voltage to the first pulling down node and the second pulling down node when receiving the voltage signal at the pulling up node, and the negative power supply voltage to the pulling up node and the output terminal when receiving a voltage signal at the second pulling down node.

* * * * *